US006975559B2

(12) United States Patent
Perroni et al.

(10) Patent No.: US 6,975,559 B2
(45) Date of Patent: Dec. 13, 2005

(54) DEVICE AND METHOD FOR READING NON-VOLATILE MEMORIES HAVING AT LEAST ONE PSEUDO-PARALLEL COMMUNICATION INTERFACE

(75) Inventors: Maurizio Perroni, Catania (IT); Salvatore Polizzi, San Giovanni La Punta (IT); Salvatore Poli, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 121 days.

(21) Appl. No.: 10/452,762

(22) Filed: May 30, 2003

(65) Prior Publication Data

US 2004/0001366 A1    Jan. 1, 2004

(30) Foreign Application Priority Data

May 31, 2002  (IT)  ............................ MI2002A1185

(51) Int. Cl.[7] ............................................. G11C 11/00
(52) U.S. Cl. .............................. 365/233.5; 365/230.01; 365/201; 365/233
(58) Field of Search .......................... 365/230.01, 233, 365/233.5, 189.01, 201

(56) References Cited

U.S. PATENT DOCUMENTS

| 4,829,475 | A | * | 5/1989 | Ward et al. ..................... 365/78 |
| 4,839,866 | A | * | 6/1989 | Ward et al. ..................... 365/221 |
| 5,306,963 | A | * | 4/1994 | Leak et al. ..................... 327/14 |
| 5,543,975 | A | * | 8/1996 | Curran ......................... 360/45 |
| 5,548,560 | A | * | 8/1996 | Stephens et al. ......... 365/233.5 |
| 5,953,261 | A | * | 9/1999 | Furutani et al. ....... 365/189.05 |
| 6,079,001 | A | * | 6/2000 | Le et al. ...................... 711/167 |
| 6,111,787 | A | * | 8/2000 | Akaogi et al. ........ 365/185.11 |
| 6,125,051 | A | * | 9/2000 | Kang .......................... 365/145 |
| 6,205,069 | B1 | * | 3/2001 | Kim ............................ 365/203 |
| 6,278,653 | B1 | * | 8/2001 | Hardee ........................ 365/233 |
| 6,285,627 | B1 | * | 9/2001 | Kurihara et al. ......... 365/233.5 |
| 6,292,403 | B1 | * | 9/2001 | Pancholy et al. ...... 365/189.05 |
| 6,324,115 | B1 | * | 11/2001 | Choi ..................... 365/230.03 |
| 6,633,966 | B1 | * | 10/2003 | Koyama .................... 711/200 |
| 6,741,515 | B2 | * | 5/2004 | Lazar et al. ................ 365/222 |
| 6,744,684 | B2 | * | 6/2004 | Arimoto et al. ............ 365/222 |
| 6,751,144 | B2 | * | 6/2004 | Takahashi et al. .......... 365/222 |
| 6,891,775 | B2 | * | 5/2005 | Takeuchi .................. 365/233.5 |
| 6,903,983 | B2 | * | 6/2005 | Hara et al. ............. 365/189.04 |

FOREIGN PATENT DOCUMENTS

| JP | 407029375 A | * | 1/1995 | ............ G11C 1/41 |
| JP | 408055485 A | * | 2/1996 | ........... G11C 16/06 |
| JP | 408293198 A | * | 11/1996 | ........... G11C 16/06 |
| JP | 410275462 A | * | 10/1998 | ......... G11C 11/401 |

* cited by examiner

Primary Examiner—Viet Q. Nguyen
(74) Attorney, Agent, or Firm—Lisa K. Jorgenson; Bryan A. Santarelli; Graybeal Jackson Haley LLP

(57) ABSTRACT

The invention relates to a method for testing non-volatile memory devices that have at least one parallel communication interface, and a conventional matrix of non-volatile memory cells with respective reading, changing and erasing circuits, wherein during the testing procedure, a reading mode is entered for reading a memory location upon the rise edge of a control signal producing a corresponding ATD signal. Advantageously in the invention, a subsequent reading step is started also upon the fall edge of the control signal.

In this way, at each cycle of the control signal two memory locations, instead of one as in the prior art, are read.

25 Claims, 4 Drawing Sheets

DEVICE AND METHOD FOR READING NON-VOLATILE MEMORIES HAVING AT LEAST ONE PSEUDO-PARALLEL COMMUNICATION INTERFACE

PRIORITY CLAIM

This application claims priority from Italian patent application No. MI2002A 001185, filed May 31, 2002, which is incorporated herein by reference.

TECHNICAL FIELD

The present invention relates generally to a method for reading non-volatile memories having at least one pseudo-parallel communication interface.

An embodiment of the invention concerns a testing and debugging method for use at the EWS/Final Test stage of integrated flash memories in PC Bios applications operating on a PCI bus at 33 MHz. The method provides a comprehensive test procedure that covers all possible device defects.

Another embodiment of the invention relates to an electronic memory device which is monolithically integrated on a semiconductor and has a pseudo-parallel interface associated therewith.

Yet another embodiment of the invention particularly relates to a standard flash memory which is integrated with an LPC (Low Pin Count) interfacing block used in normal operation applications, and with a parallel interfacing block primarily used for testing. Accordingly, the memory device incorporates two communication interfaces: namely a serial interface and a parallel or pseudo-parallel interface.

BACKGROUND

The electronic integrated memory device to which the embodiments of the invention are directed has eleven address outer pins, eight data pins and some control pins, among which are provided a synchronism or clock signal, CLK, and a signal used for setting the two IC interfaces provided.

Currently, testing flux software both for EWS or on-wafer testing and Final Test for testing on an assembled device has been intended for operation in the parallel mode.

Briefly, all the addresses and data under consideration have been used in the parallel mode during testing operation, whereas only the clock signal CLK and another four pins are necessary for the serial communication protocol.

As it is well known in the art, reading a memory location from the cell matrix requires that the address of the location is input first. This operation is usually performed according to a timing procedure, shown in FIG. 1 herewith attached.

Referring to the timing diagram of FIG. 1, the memory location addresses are input as two groups or packets of eleven bits each. The control RC falling and rising edges generate two latching pulses COL and ROW for the column and row of the matrix, respectively.

Thus, it is only at the end of a signal cycle RC that a complete address of the memory location to be read can be fully reconstructed. In other words, all of the internal reading timings start only at the end of the cycle RC.

More particularly, the rising edge of the control signal RC will cause the known ATD (Address Transition Detection) pulse, which will set off the whole reading mechanism.

FIG. 2 shows, by way of example, some of the signals that are present in the memory device during the reading operation; the arrows indicate the dependency of certain signals on other previously generated signals.

As mentioned, the rising edge of the signal RC sets off the ATD signal, which in turn will generate the signal READING and consequently the signal SALATCH, which stores data output from the reading sense amplifiers.

It can be appreciated that the address inputting mechanism described above is fairly complicated and it involves, especially while testing, a more elaborate control software and also extended duration for the whole testing procedure, which immediately results in increased cost of the integrated-memory-circuit product.

Therefore, a need has arisen for a novel testing procedure with appropriate functional features that allow the procedure to be carried out through the parallel interface, so that higher output levels than in the prior art can be achieved.

SUMMARY

One embodiment of the invention involves exploiting the falling edge of the control signal RC to generate an additional ATD pulse and thus start a new reading, after storing only the columns in the internal addresses.

More specifically, this embodiment includes a method for testing non-volatile memory devices that have at least one parallel communication interface, and have a matrix of non-volatile memory cells with respective reading, changing, and erasing circuits, wherein during the testing step, a reading mode is entered for reading a memory location upon the rising edge of a control signal producing a corresponding signal; characterized in that a subsequent reading operation is started also upon the falling edge of said control signal.

Another embodiment of the invention relates to an electronic memory device being monolithically integrated on a semiconductor and having at least one parallel interface and a matrix of non-volatile memory cells with respective row and column decoding circuits and circuits for reading, changing, and erasing the contents of the memory cells, characterized in that it comprises a first generator block for generating impulsive row and column addressing signals, said first generator block receiving a control signal, and comprises a second generator block for generating an ATD signal, said second generator block receiving in turn said control signal and being operatively linked to both the rising and the falling edges of said control signal.

BRIEF DESCRIPTION OF THE DRAWINGS

Features and potential advantages of the various aspects of the invention should become apparent from the following description of embodiments thereof, given by way of non-limitative examples with reference to the accompanying drawings.

DETAILED DESCRIPTION

Figure 4:
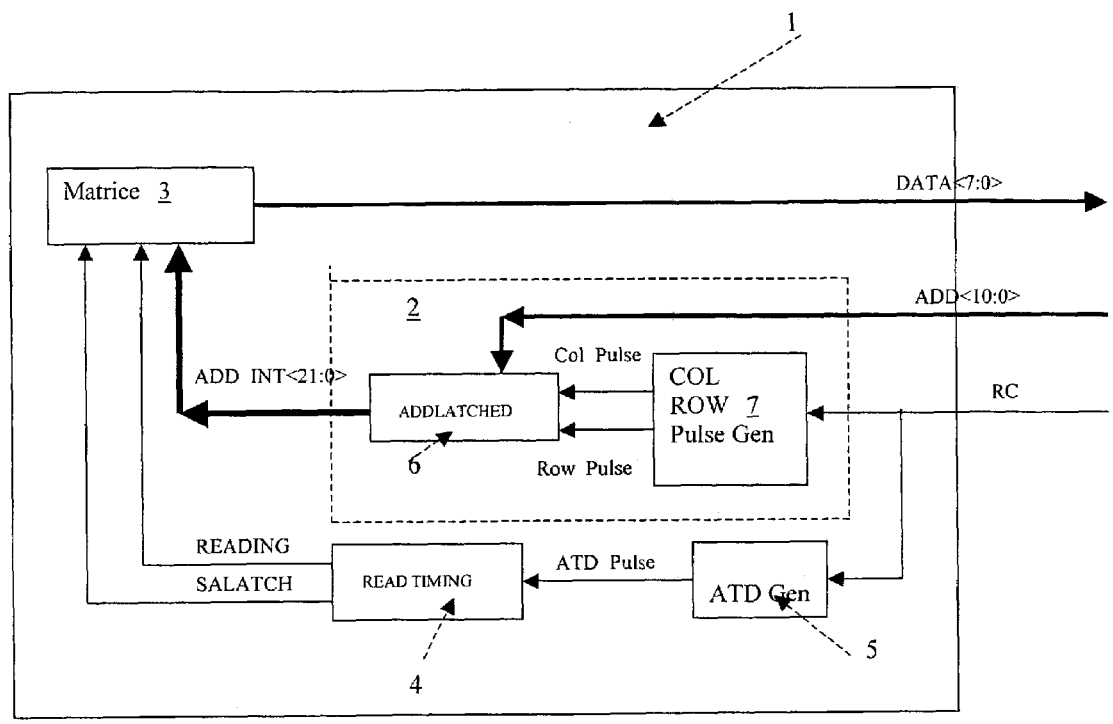
FIG. 4 is a block diagram of an electronic memory device made in accordance with an embodiment of this invention.

Referring to FIG. 4, an electronic memory device made in accordance with an embodiment of this invention is generally and schematically shown at 1.

The device 1 is a non-volatile memory integrated on a semiconductor, such as a flash EEPROM, of a kind that can be electrically written and erased. However, the following considerations can be applied to other memory devices as well.

The device 1 has a parallel interface 2 for testing operations.

The device 1 conventionally comprises a matrix 3 of non-volatile memory cells and respective row and column decoding circuits, as well as circuit portions (not shown because they are conventional) for reading, changing, and erasing data stored in the memory.

The device 1 also comprises a number of circuit blocks, to be described herebelow, which are interlinked through a set of bus connections.

A first block 7 is a pulse generator that receives a control signal RC.

The block 7 outputs two different types of pulses: a column pulse Col-Pulse and a row pulse Row-Pulse, both applied to an address storage block 6.

The storage block 6 comprises a number of latch registers and receives, additionally to the signals from the block 7, an eleven-bit address on an address bus ADD<10:0>, and temporarily stores the addresses of certain locations of the memory 3.

The storage block 6 has an output connected to the memory-cell matrix 3 through a twenty-two bit internal address bus ADD_INT<21:0>. The matrix 3 outputs data through a data bus DATA<7:0>.

A branch of the signal RC is applied to a block 5 generating ATD signals, this block outputting an impulsive signal ATD_Pulse applied to a read-timing circuit block 4.

This block 4 outputs a pair of signals READING and SALATCH, which are transmitted to the matrix 3 in order to enable data reading operations.

Figure 1:
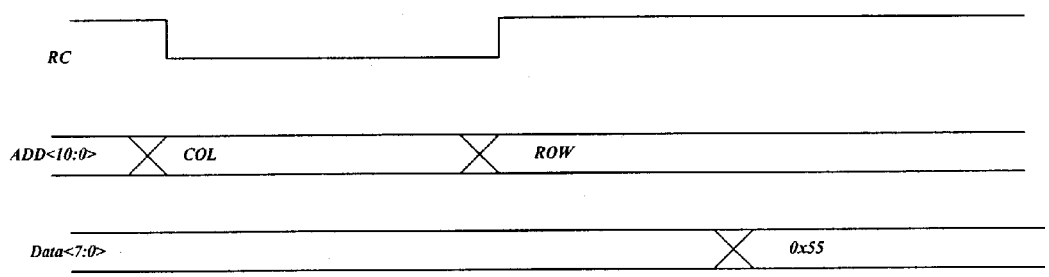
FIG. 1 is a diagram showing the timing of a control signal RC and of other read enabling signals relating to a conventional parallel-read testing protocol.
Figure 2:
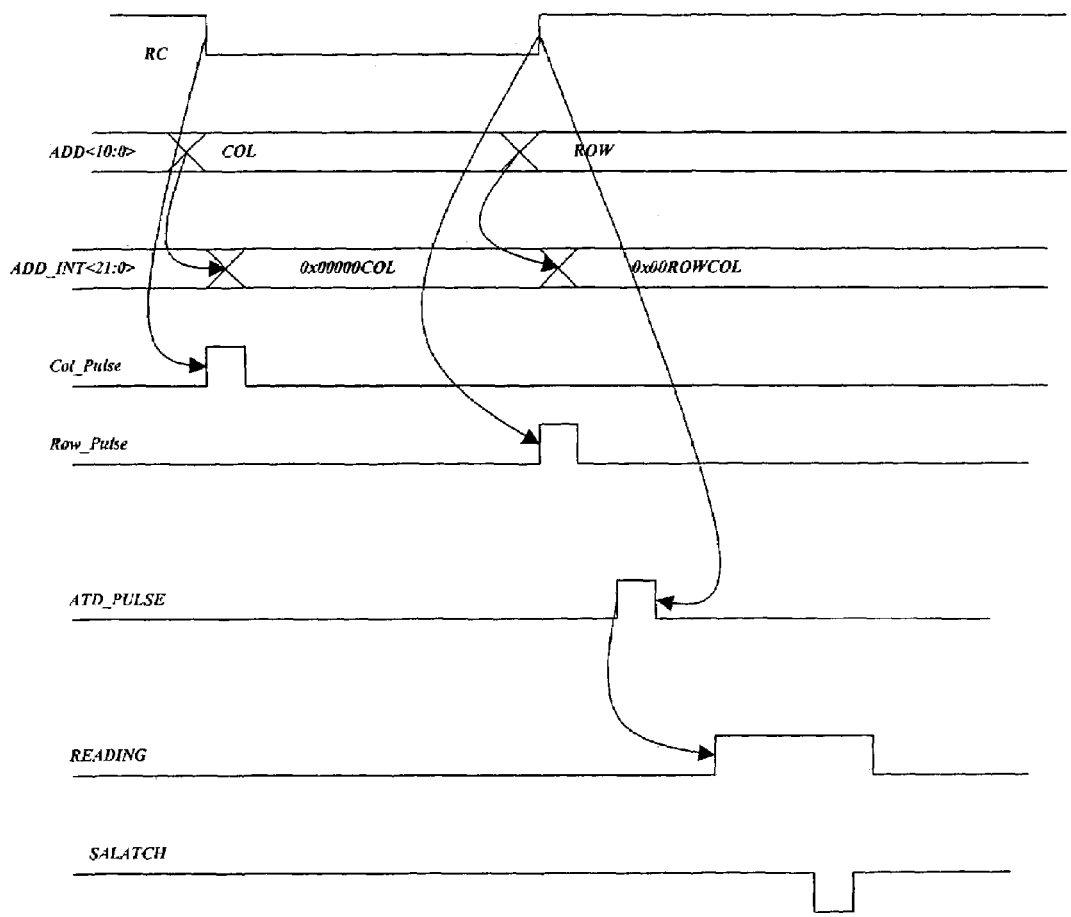
FIG. 2 is a diagram showing the timing of additional signals driving access to the memory device while reading the contents of the memory cells according to the prior art.
Figure 3:
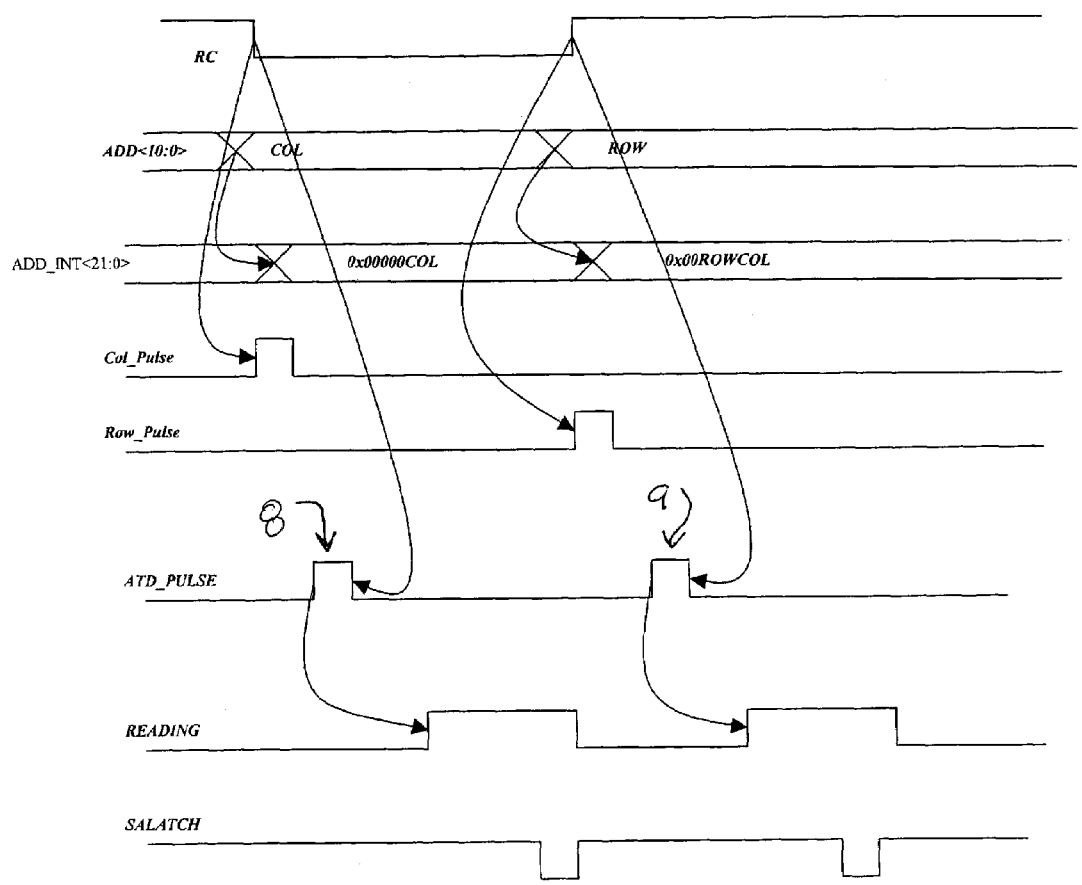
FIG. 3 is a diagram showing the timing of a control signal RC and of other read enabling signals relating to a reading test cycle according to an embodiment of this invention.

Referring to FIG. 3, in one embodiment of this invention, the test duration time is shortened by implementing a novel reading mode wherein both the rising and falling edges of the signal RC can be used.

It can be seen in FIG. 3 that an additional ATD 8 pulse is generated also at the falling edge of the signal RC, thus starting a subsequent, new reading operation after which only the column addresses are stored in the registers of block 6.

Briefly, this subsequent reading operation will be performed upon the pulse Col_Pulse being received, before the pulse Row_Pulse is also received.

In this way, by suitably shifting the addresses through the testing procedure managing programs, the whole matrix can be read thus significantly reducing testing time, since at each cycle of the control signal RC two memory locations are read, instead of one as in the prior art.

Of course, the first ATD pulse 9 will in turn set off the whole mechanism that issues the read enabling signals READING and SALATCH for the sense amplifiers.

As a result, the second ATD pulse 8, produced on the falling edge of the signal RC, will also activate a full reading cycle upon the read enabling signals READING and SALATCH being issued.

The reading mechanism takes a shorter time than 100 ns, this typically being the shortest duration of the RC pulse as per the specifications of integrated memory circuits.

The above-described embodiments of this invention do solve the technical problem, and offer a number of advantages, the first advantage is that reading time during the testing procedure is dramatically reduced because the memory can be accessed twice during a single cycle of the control signal RC.

Furthermore, all the above is achieved at the expense of only minor modifications to the memory device construction and at low cost.

An integrated circuit, such as the memory circuit 1 of FIG. 4, that allows testing according to the above-described procedure can be incorporated into an electronic system (not shown), such as a computer system, according to an embodiment of the invention.

From the foregoing it will be appreciated that, although specific embodiments of the invention have been described herein for purposes of illustration, various modifications may be made without deviating from the spirit and scope of the invention. For example, the above technique can also be used to write data to a memory.

What is claimed is:

1. A method for testing non-volatile memory devices that have at least one parallel communication interface, and have a conventional matrix of non-volatile memory cells with respective reading, changing and erasing circuits, wherein during the testing procedure, a reading mode is entered for reading a memory location upon the rise edge of a control signal producing a corresponding ATD signal; wherein a subsequent reading operation is started upon the fall edge of said control signal.

2. A method according to claim 1, wherein a second ATD signal is generated concurrently with the start of said subsequent reading operation.

3. A method according to claim 1, wherein two memory locations are read at each cycle of said control signal.

4. A method according to claim 2, wherein said second ADT signal enables a full reading cycle.

5. A method according to claim 4, wherein the duration of said full reading cycle is less than 100 ns.

6. A method according to claim 1, wherein said subsequent reading occurs after only the columns in the internal addresses are stored.

7. An electronic memory device, being monolithically integrated on a semiconductor and having at least one parallel interface and a matrix of non-volatile memory cells with respective row and column decoding circuits and circuits for reading, changing and erasing the contents of the memory cells, the memory device comprising a first generator block for generating impulsive row and column address signals, said first generator block receiving a control signal, and comprises a second generator block for generating an ATD signal, said second generator block receiving in turn said control signal and being operatively linked to both the rise and the fall edge of said control signal.

8. A device according to claim 7, further comprising an address storage block being input an address bus and impulsive signals from said first generator block in order to temporarily store only the column addresses upon the rise edge of said control signal being received.

9. A device according to claim 7, wherein it is a flash memory.

10. A method, comprising:
accessing a first location of a memory in response to a first transition of a control signal;

generating a first address-transition-detection pulse in response to a second transition of the control signal, the second transition being opposite to the first transition; and accessing a second location of the memory in response to the address-transition-detection pulse.

11. The method of claim 10 wherein:
the first transition comprises a falling edge of the control signal; and
the second transition comprises a rising edge of the control signal.

12. The method of claim 10 wherein:
the first transition comprises a rising edge of the control signal; and
the second transition comprises a falling edge of the control signal.

13. A method, comprising:
accessing a first location of a memory in response to a first transition of a control signal;
accessing a second location of the memory in response to a second transition of the control signal, the second transition being opposite to the first transition;
wherein accessing the first location comprises,
storing a column address in response to the first transition of the control signal, and
providing to the memory a location address that includes the column address and a first row address stored before the first transition of the control signal; and
wherein accessing the second location comprises,
storing a second row address in response to the second transition of the control signal, and
providing to the memory a location address that includes the column address and the second row address.

14. A method, comprising:
accessing a first location of a memory in response to a first transition of a control signal;
accessing a second location of the memory in response to a second transition of the control signal, the second transition being opposite to the first transition;
wherein accessing the first location comprises,
storing a row address in response to the first transition of the control signal, and
providing to the memory a location address that includes the row address and a first column address stored before the first transition of the control signal; and
wherein accessing the second location comprises,
storing a second column address in response to the second transition of the control signal, and
providing to the memory a location address that includes the row address and the second column address.

15. The method of claim 10 wherein:
accessing the first location comprises writing data to the first location; and
accessing the second location comprises writing data to the second location.

16. The method of claim 10 wherein:
accessing the first location comprises reading data from the first location; and
accessing the second location comprises data from the second location.

17. An integrated circuit, comprising:
a nonvolatile memory having multiple locations;
a control node operable to receive a control signal having first-type edges and opposite second-type edges; and
a memory-access circuit coupled to the memory and to the control node and operable to,
access a first location of the memory in response to a first-type edge of the control signal, and
access a second location of the memory in response to a second-type edge of the control signal.

18. An integrated circuit, comprising:
a memory having multiple locations;
a control node operable to receive a control signal having first-edged and opposite second-type edges;
a memory-access circuit couple to the memory and to the control node and operable to,
access a first location of the memory in response to a first-type edge of the control signal, and
access a second location of the memory in response to a second-type edge of the control signal; and
wherein the memory-access circuit comprises an address-transition-detect generator that is operable to,
access the first location of the memory by generating a first address-transition-detect pulse in response to the first-type edge of the control signal, and
access the second location of the memory by generating a second address-transition-detect pulse in response to the second-type edge of the control signal.

19. An integrated circuit, comprising:
a memory having multiple locations;
a control node operable to receive a control signal having first-type edges and opposite second-type edges;
a memory-access circuit coupled to the memory and to the control node and operable to,
access a first location of the memory in response to a first-type edge of the control signal, and
access a second location of the memory in response to a second-type edge of the control signal;
address nodes; and
wherein the memory access circuit is coupled to the address nodes and comprises an address latch that is operable to,
in response to the first-type edge of the control signal, latch from the address nodes a column address of the first and second locations and provide to the memory the column address and a previously latched row address of the first location, and
in response to the second-type edge of the control signal, latch from the address nodes a row address of the second location and provide to the memory the column address and the row address of the second location.

20. An integrated circuit, comprising:
a memory having multiple locations;
a control node operable to receive a control signal having first-type edges and opposite second-type edges;
a memory-access circuit coupled to the memory and to the control node and operable to,
access a first location of the memory in response to a first-type edge of the control signal, and
access a second location of the memory in response to a second-type edge of the control signal;
address nodes; and
wherein the memory access circuit is coupled to the address nodes and comprises an address latch that is operable to, in response to the first-type edge of the control signal, latch from the address nodes a row address of the first and second locations and provide to the memory the row address and a previously latched column address of the first location, and in response to the second-type edge of the control signal, latch from the address nodes a column address of the second location and provide to the memory the row address and the column address of the second location.

21. An integrated circuit, comprising:
a memory having multiple locations;
a control node operable to receive a control signal having first-type edges and opposite second-type edges;
a memory-access circuit coupled to the memory and to the control node and operable to,
  access a first location of the memory in response to a first-type edge of the control signal, and
access a second location of the memory in response to a second-type edge of the control signal; and
wherein the memory-access circuit is further operable to,
  access the first and second locations of the memory in response to the first-type and second-type edges of the control signal during a test mode of operation; and
  access the first and second locations of the memory in response to only the first-type edges of the control signal during a normal mode of operation.

22. An electronic system, comprising:
an integrated circuit having,
  a nonvolatile memory having multiple locations,
  a control node operable to receive a control signal having first-type edges and opposite second-type edges, and
  a memory-access circuit coupled to the memory and to the control node and operable to,
    access a first location of the memory in response to a first-type edge of the control signal, and
    access a second location of the memory in response to a second-type edge of the control signal.

23. A method for testing a memory, comprising:
recognizing a fall in a clock control signal and at that time in the cycle,
  reading a column address,
  generating a column pulse signal,
  generating a first memory address with column decoding information,
  generating a first address transition detection signal,
  generating a first read control signal,
  generating a first sense-amplifier latch signal,
  reading a first memory address, and
  outputting a first data on a parallel interface, and subsequently recognizing a rise in a clock control signal and at that time in the cycle,
  reading a row address,
  generating a row pulse signal,
  generating a second memory address with row decoding information based on the row address and column decoding information left unchanged,
  generating a second address transition detection signal,
  generating a second read control signal,
  generating a second sense-amplifier latch signal,
  reading a second memory address, and
  outputting a second data on a parallel interface.

24. The method of claim 10 wherein accessing the first location of the memory comprises:
  generating a second address-transition-detection pulse in response to the first transition of the control signal; and
  accessing the first location of the memory in response to the second address-transition-detection pulse.

25. A method, comprising:
accessing a first location of a nonvolatile memory in response to a first transition of a control signal; and
accessing a second location of the nonvolatile memory in response to a second transition of the control signal, the second transition being opposite to the first transition.

* * * * *

UNITED STATES PATENT AND TRADEMARK OFFICE
CERTIFICATE OF CORRECTION

PATENT NO. : 6,975,559 B2
DATED : December 13, 2005
INVENTOR(S) : Maurizio Perroni, Salvatore Polizzi and Salvatore Poli It is certified that error appears in the above-identified patent and that said Letters Patent is hereby corrected as shown below:

<u>Column 5,</u>
Line 63, after "comprises", insert -- reading --.

Signed and Sealed this

Thirtieth Day of May, 2006

JON W. DUDAS
*Director of the United States Patent and Trademark Office*